(12) United States Patent
Wang

(10) Patent No.: US 9,159,746 B2
(45) Date of Patent: Oct. 13, 2015

(54) THIN FILM TRANSISTOR, MANUFACTURING METHOD THEREOF, ARRAY SUBSTRATE AND DISPLAY DEVICE

(71) Applicant: BOE TECHNOLOGY GROUP CO., LTD., Beijing (CN)

(72) Inventor: Dongfang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/123,996

(22) PCT Filed: Nov. 13, 2012

(86) PCT No.: PCT/CN2012/084542
§ 371 (c)(1),
(2) Date: Dec. 5, 2013

(87) PCT Pub. No.: WO2013/185433
PCT Pub. Date: Dec. 19, 2013

(65) Prior Publication Data
US 2014/0183541 A1   Jul. 3, 2014

(51) Int. Cl.
*H01L 29/66* (2006.01)
*H01L 27/12* (2006.01)
*H01L 29/49* (2006.01)
*H01L 29/51* (2006.01)
*H01L 29/786* (2006.01)
*G02F 1/1368* (2006.01)

(52) U.S. Cl.
CPC ........ *H01L 27/1225* (2013.01); *H01L 29/4908* (2013.01); *H01L 29/517* (2013.01); *H01L 29/66969* (2013.01); *H01L 29/7869* (2013.01); *G02F 1/1368* (2013.01)

(58) Field of Classification Search
CPC ................ H01L 29/66969; H01L 29/4908; H01L 29/517; H01L 29/7869; H01L 27/1225
USPC ....................... 257/72, 66; 438/479
See application file for complete search history.

(56) References Cited

U.S. PATENT DOCUMENTS

2002/0163049 A1 * 11/2002 Yamazaki et al. ............ 257/408
2007/0069401 A1    3/2007 Kakehata
2007/0272926 A1   11/2007 Deng et al.
(Continued)

FOREIGN PATENT DOCUMENTS

CN      1941288 A      4/2007
CN    101078842 A    11/2007
(Continued)

OTHER PUBLICATIONS

International Search Report Issued Mar. 28, 2013 Appln. No. PCT/CN2012/084542.
(Continued)

*Primary Examiner* — Trung Q Dang
(74) *Attorney, Agent, or Firm* — Ladas & Parry LLP

(57) ABSTRACT

A thin film transistor and a manufacturing method for the same, an array substrate, and a display device are disclosed. The thin film transistor comprises: a substrate (1) and a gate (2), a first gate insulating layer (3) and an active layer (4) which are disposed in order on the substrate, the first gate insulating layer (3) covers the gate (2), the active layer (4) covers the first gate insulating layer (3), and a material for the first gate insulating layer comprises aluminum oxide.

17 Claims, 3 Drawing Sheets

(56) References Cited

U.S. PATENT DOCUMENTS

| | | | |
|---|---|---|---|
| 2010/0117075 A1 | 5/2010 | Akimoto et al. | |
| 2010/0163868 A1 | 7/2010 | Yamazaki et al. | |
| 2010/0193772 A1 | 8/2010 | Morosawa et al. | |
| 2010/0301340 A1* | 12/2010 | Shih et al. | 257/59 |
| 2011/0140096 A1 | 6/2011 | Kim et al. | |
| 2011/0235389 A1* | 9/2011 | Kozuma et al. | 365/104 |
| 2011/0309876 A1* | 12/2011 | Terai et al. | 327/534 |

FOREIGN PATENT DOCUMENTS

| | | |
|---|---|---|
| CN | 101527322 A | 9/2009 |
| CN | 101794737 A | 8/2010 |
| CN | 101794823 A | 8/2010 |
| CN | 102097486 A | 6/2011 |
| CN | 102723359 A | 10/2012 |

OTHER PUBLICATIONS

First Chinese Office Action Issued Apr. 3, 2014 Appln. No. 201210196002.3.

International Preliminary Report on Patentability Appln. No. PCT/CN2012/084542: Dated Dec. 16, 2014.

* cited by examiner

THIN FILM TRANSISTOR, MANUFACTURING METHOD THEREOF, ARRAY SUBSTRATE AND DISPLAY DEVICE

TECHNICAL FIELD

Embodiments of the present invention relate to a thin film transistor and a method for manufacturing the same, an array substrate and a display device.

BACKGROUND

With the development of thin film transistor (TFT) liquid crystal display technology, customers' requirements on TFT liquid crystal displays are becoming higher and higher.

Among the others, oxide transistor technology has characteristics of high mobility and good homogeneity, therefore liquid crystal displays applying oxide transistors are relate to one of the main development directions of liquid crystal display technology.

In prior art, liquid crystal displays using oxide transistors such as indium gallium zinc oxide transistors have attracted broad attention due to their advantages such as ease of large area production and compatibility with existing production lines.

However, silicon oxide or silicon nitride acting as a gate insulating layer can not effectively barrier hydrogen and moisture to diffuse to an active layer, which therefore may destroy the electric performance of the formed oxide transistor, and may cause threshold voltage drift of the oxide transistor, thereby making power consumption of the oxide transistor overly large.

SUMMARY

The embodiments of the present invention provide a TFT and a manufacturing method for the same, an array substrate and a display device that can better control electric performance.

An aspect of embodiments of the present invention provides a thin film transistor comprising: a substrate and a gate, a first gate insulating layer and an active layer which are disposed in order on the substrate, the first gate insulating layer covers the gate, the active layer covers the first gate insulating layer, and a material for the first gate insulating layer comprises aluminum oxide.

Another aspect of embodiments of the present invention provides an array substrate comprising at least one thin film transistor comprising: a substrate and a gate, a first gate insulating layer, an active layer and an etching stop layer disposed in order on the substrate, the first gate insulating layer covers the gate, the active layer covers the first gate insulating layer, and a material for the first gate insulating layer comprises aluminum oxide.

Yet another aspect of embodiments of the present invention provides an display device comprising at least one thin film transistor comprising: a substrate and a gate, a first gate insulating layer, an active layer and an etching stop layer disposed in order on the substrate, the first gate insulating layer covers the gate, the active layer covers the first gate insulating layer, and a material for the first gate insulating layer comprises aluminum oxide.

Yet another aspect of embodiments of the present invention provides a manufacturing method for thin film transistor comprising:

forming a gate on a substrate by patterning process;

forming a first gate insulating layer covering the gate, wherein a material for the first gate insulating layer comprises aluminum oxide; and forming the active layer.

The TFT and manufacturing method for the same, the array substrate and the display device provided in embodiments of the present invention have the active layer cover the gate insulating layer and the gate and form a gate insulating layer containing aluminum oxide. Since aluminum oxide has good compactness, it can effectively prevent hydrogen and moisture from diffusing into the gate insulating layer and the gate, thereby making electric performance of the TFT more stable. In addition, forming of the gate insulating layer by an in-situ reaction of the gate can better control the thickness of the gate insulating layer, better adjust the threshold voltage of the TFT, and reduce power loss during charging process.

BRIEF DESCRIPTION OF THE DRAWINGS

For better understanding technical proposals according to embodiments of the present invention, drawings of the embodiments will be described briefly below. Obviously, drawings in the following description only relate to some embodiments of the present invention, not to limit the present invention.

DETAILED DESCRIPTION

In order to make the purpose, technology solution and advantages of embodiments of the present invention more clear, technology solutions according to embodiments of the present invention will be described clearly and completely below with respect to drawings of embodiments of the present invention. It is to be understood that the described embodiments are part of but not all of embodiments of the present invention. Based on the described embodiments of the present invention, all other embodiments obtained by those of ordinary skill in the art without any creative labor fall into the protecting scope of the present invention.

Hereinafter, a TFT and a method for manufacturing the same, an array substrate and a display device according to embodiments of the present invention will be described in detail with respect to drawings.

It should be understood that the described embodiments are only a part of embodiments of the present invention rather than all of them. Based on embodiments in the present invention, all other embodiments obtained by one skilled in the art without creative labor belong to the protection scope of the present invention.

Figure 1:
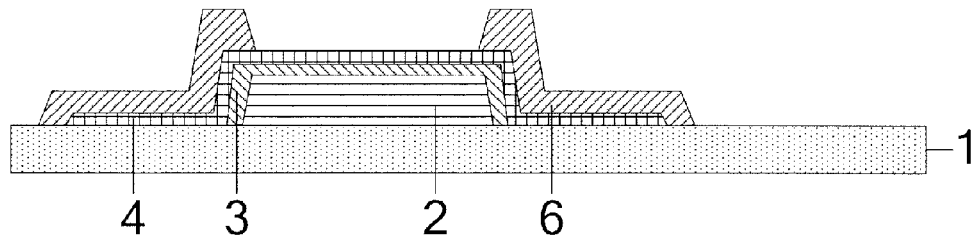
FIG. 1 is the first structural representation of a TFT according to an embodiment of the present invention.

A thin film transistor (TFT) as illustrated in FIG. 1 comprises: a substrate 1 and a gate 2, a first gate insulating layer 3, an active layer 4 and a source-drain electrode layer 6 disposed on the substrate 1 in order, wherein the first gate insulating layer 3 covers the gate 2, the active layer 4 covers the first gate insulating layer 3, and a material for the first gate insulating layer 3 comprises aluminum oxide.

The source-drain electrode layer 6 covers the substrate 1 and extends beyond the active layer 4 and makes full contact with the active layer 4.

The gate 2 may be faulted of one or more materials selected from molybdenum, molybdenum neodymium alloy, aluminum, aluminum neodymium alloy, titanium and copper, and may be formed into a single layer or a composite multi-layer. For example, the gate 2 may be a single layer or a multi-layer composite film formed of molybdenum, aluminum, or aluminum alloy containing molybdenum. The gate 2 may have a thickness of 1000~3000 nm. For example, an etching stop layer and a passivation layer may be formed on the source-drain electrode layer.

Among them, a material for the source-drain electrode layer 6 may be one or any combination of molybdenum, tungsten molybdenum alloy, aluminum neodymium alloy or copper.

A material for the active layer 4 may be indium gallium zinc oxide, indium gallium zinc oxide, hafnium indium zinc oxide, indium zinc tin oxide, yttrium indium zinc oxide, or amorphous silicon.

A material for the etching stop layer may be one or any combination of silicon dioxide, hafnium oxide, aluminum oxide, aluminum nitride and silicon oxide.

A material for the passivation layer may be one or any combination of silicon oxide, silicon nitride, silicon oxynitride, polyimide, polymethyl methacrylate or polyvidone.

For example, in the fabrication process of the gate 2 with aluminum (Al) as the material, the first gate insulating layer 3 comprising an aluminum oxide material may be formed by bombing plasma onto the gate. The reaction occurring during manufacture is: $xO^{2-}+Al=AlOx+2xe$ (AlOx is amorphous aluminum oxide, x is the molar ratio between oxyanion and aluminum ion in the aluminum oxide). Amorphous aluminum oxide is formed in-situ via this reaction.

In a TFT provided in an embodiment of the present invention, the active layer covers the gate insulating layer and the gate, and forms the gate insulating layer containing aluminum oxide. Since aluminum oxide has good compactness, it can effectively prevent hydrogen and moisture from diffusing into the gate insulating layer and the gate, thereby making electric performance of the TFT more stable. In addition, forming of the gate insulating layer by an in-situ reaction on the gate can better control thickness of the gate insulating layer, better adjust the threshold voltage of the TFT and reduce power loss in charging process. For example, it is possible to control the thickness of the gate insulating layer more precisely by controlling the reaction speed and the reaction time.

Figure 2:
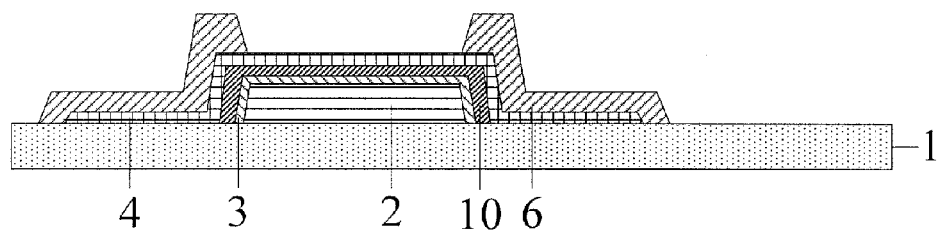
FIG. 2 is the second structural representation of a TFT according to an embodiment of the present invention.

In order to further control the electric performance of the TFT, as illustrated in FIG. 2, a second gate insulating layer 10 may be further disposed between the first gate insulating layer 3 and the active layer 4; the second gate insulating layer 10 covers the first gate insulating layer 3, and a material for the second gate insulating layer 10 comprise aluminum oxynitride.

The implementation process of forming aluminum oxynitride by an in-situ reaction is as follows: the following reaction occurs in the process of bombing the amorphous aluminum oxide AlOx by plasma nitrogen: $AlOx+(1-2x/3)N^{3-}=Al(OxN(1-2x/3))+3(1-2x/3)e$, Amorphous aluminum oxynitride is formed via this reaction.

Figure 3:
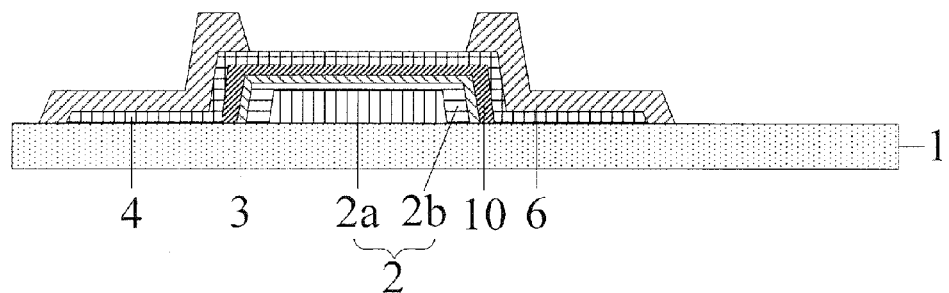
FIG. 3 is the third structural representation of a TFT according to an embodiment of the present invention.

In order to further improve conductivity performance of the TFT, as illustrated in FIG. 3, the gate 2 is layered into an inner gate layer 2a and an outer gate layer 2b; the material for the inner gate layer 2a is copper and the material for the outer gate layer 2b comprises aluminum.

First Embodiment

Figure 4:
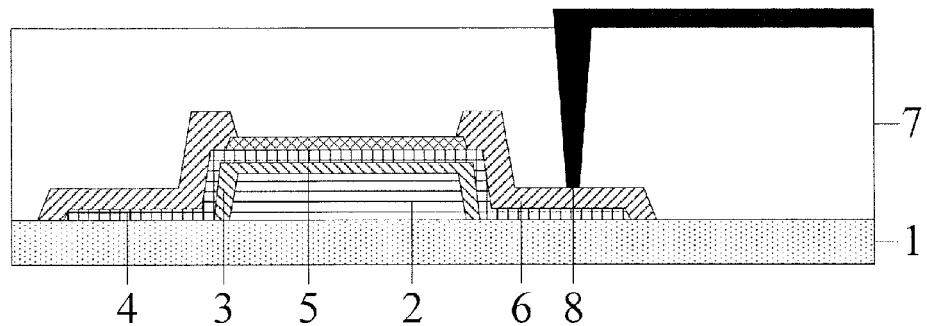
FIG. 4 is a structural representation of an array substrate according to a first embodiment of the present invention.

Correspondingly to the above-mentioned TFT, an embodiment of the present invention further provides an array substrate as illustrated in FIG. 4, comprising at least one TFT comprising a substrate 1 and a gate 2, a first gate insulating layer 3, an active layer 4, an etching stop layer 5, a source-drain electrode layer 6, a passivation layer 7 and a pixel electrode 8 disposed on the substrate 1 in order; the first gate insulating layer 3 covers the gate 2, the active layer 4 covers the first gate insulating layer 3, and a material for the first gate insulating layer 3 comprises aluminum oxide. For example, the first gate insulating layer 3 covers the upper surface and the lateral surfaces of the gate 2; and the active layer 4 covers the upper surface and lateral surfaces of the first gate insulating layer 3.

The gate 2 containing aluminum is disposed on the substrate 1; and the first gate insulating layer 3 containing aluminum oxide, the active layer 4 and the etching stop layer 5 are disposed in order from bottom to top on the gate 2.

The first gate insulating layer 3 containing aluminum oxide covers the gate 2 and is formed by an in-situ reaction of the gate 2 containing aluminum.

The active layer 4 extends on the substrate 1 on both sides of the first gate insulating layer 3 containing aluminum oxide.

The source-drain electrode layer 6 covers the substrate 1 and extends beyond the active layer 4 and makes full contact with the active layer 4, and contacts the etching stop layer 5.

Figure 5:
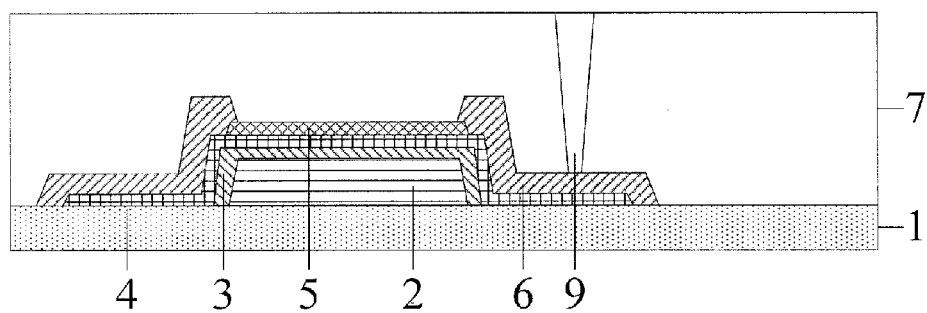
FIG. 5 is a structural representation of a via formed by etching in the array substrate according to the first embodiment of the present invention.

The passivation layer 7 covers onto the substrate 1 that has formed thereon the gate 2, the first gate insulating layer 3, the active layer 4, the etching stop layer 5 and the source-drain electrode layer 6; as illustrated in FIG. 5, a via 9 exposing the drain of one side of the source-drain electrode layer 6 is formed by etching on the passivation layer 7; as illustrated in FIG. 4, the pixel electrode 8 is disposed in the via 9 and on the surface of the passivation layer 7 to make the pixel electrode 8 contact the drain of one side of the source-drain electrode layer 6.

Among them, a material for the source-drain electrode layer 6 may be one or any combination of molybdenum, tungsten molybdenum alloy, aluminum neodymium alloy and copper.

The material for the active layer 4 may be indium gallium zinc oxide, indium gallium zinc oxide, hafnium indium zinc oxide, indium zinc tin oxide, yttrium indium zinc oxide or amorphous silicon.

The material for the etching stop layer 5 may be one or any combination of silicon dioxide, hafnium oxide, aluminum oxide, aluminum nitride and silicon oxide.

The material for the passivation layer 7 may be one or any combination of silicon oxide, silicon nitride, silicon oxynitride, polyimide, polymethyl methacrylate and polyvidone.

The material for the pixel electrode 8 may be indium tin oxide, indium zinc oxide, polyethylene dioxy-thiophene or graphene.

The material for the substrate 1 may be glass or plastic.

For example, the thickness of gate 2 may be 1000~3000 nm. Since the thickness of gate 2 can directly influence the performance of TFT, for example, the first gate insulating layer 3 is formed by an in-situ reaction of the gate 2 containing aluminum, then the remaining gate material after forming the first gate insulating layer 3 forms the gate. Therefore, aluminum in the gate 2 can be reacted into aluminum oxide through an in-situ reaction to better adjust the thickness of gate 2. In addition, it is noted that, in case that the first gate insulating layer 3 is formed by an in-situ reaction of the gate, the thickness of the first gate insulating layer and the thickness of the finally formed gate can be controlled by the initial gate thickness and the degree and extent of the reaction. Therefore, both the thickness of the first gate insulating layer and the thickness of the gate can be effectively controlled. In the fabrication process of the gate insulating layer 3, the following reaction can be implemented by bombing the gate with plasma: $xO^{2-}+Al=AlOx+2xe$ (AlOx is amorphous aluminum oxide, x is the molar ratio between oxyanion and aluminum ion in the aluminum oxide), and amorphous aluminum oxide is formed in-situ via this reaction.

Furthermore, for example, the in-situ reaction can be realized by a magnetron sputtering apparatus or a chemical vapor deposition apparatus.

The embodiment of the present invention provides an array substrate wherein the active layer covers the gate insulating layer and the gate and forms the gate insulating layer containing aluminum oxide, thereby making the gate insulating layer have better etching selectivity with respect to the etching stop layer, avoiding over-etching phenomenon occurring for the gate and active layer during an etching process. Furthermore, since aluminum oxide has good compactness, it can effectively prevent hydrogen and moisture from diffusing into the gate insulating layer and the gate, thereby making electric performance of the TFT more stable. In addition, forming of the gate insulating layer by an in-situ reaction of the gate can better control the thickness of the gate insulating layer, better adjust threshold voltage of the TFT, and decrease power loss in the charging process.

Second Embodiment

With the array substrate according to the first embodiment, when charging the first gate insulating layer 3 formed of aluminum oxide, many interface charges may occur on the first gate insulating layer 3, which tends to result in breakdown of the first gate insulating layer 3, conducting the gate 2 and the active layer 4 on its both sides, and destroying the array substrate comprising the TFT.

Figure 6:
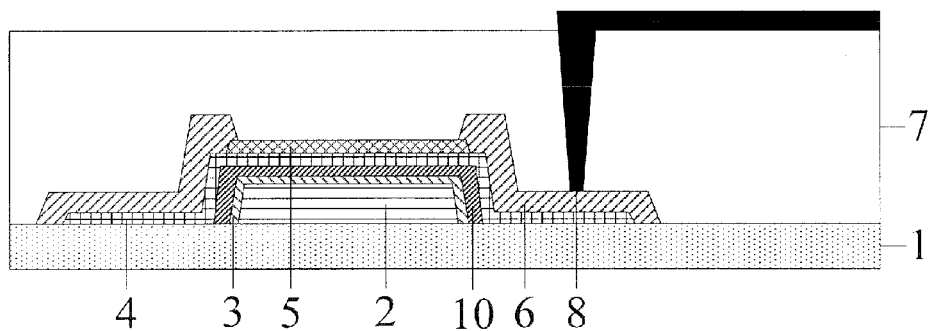
FIG. 6 is a structural representation of an array substrate according to a second embodiment of the present invention.

In order to address the above problem, as illustrated in FIG. 6, a second gate insulating layer 10 may be further disposed between the first gate insulating layer 3 and the active layer 4; the second gate insulating layer 10 covers the first gate insulating layer 3, and a material for the second gate insulating layer 10 comprise aluminum oxynitride. For example, the second gate insulating layer 10 covers the upper surface and the lateral surfaces of the first gate insulating layer 3.

In the fabrication process of the array substrate, after forming of the first gate insulating layer 3 containing aluminum oxide on the surface of the gate 2 containing aluminum, an in-situ reaction is conducted on the first gate insulating layer 3 in presence of nitrogen and oxygen plasma to form the second gate insulating layer 10.

The implementation process of forming aluminum oxynitride by an in-situ reaction is as follows: the following reaction occurs during the process of bombing the amorphous aluminum oxide (AlOx) with plasma nitrogen: $AlOx+(1-2x/3)N^{3-}=Al(OxN(1-2x/3))+3(1-2x/3)e$, and amorphous aluminum oxynitride is formed via this reaction.

Introduction of nitrogen element can suppress the penetration of impurity ions, passivate the interface state, thereby improving reliability of the TFT and better controlling electric performance of the TFT.

For example, the first gate insulating layer 3 and the second gate insulating layer 10 may also be subjected to an annealing process to eliminate the stress within the first gate insulating layer 3 and the second gate insulating layer 10, allowing the first gate insulating layer 3 and the second gate insulating layer 10 have better physical performance.

Third Embodiment

Figure 7:
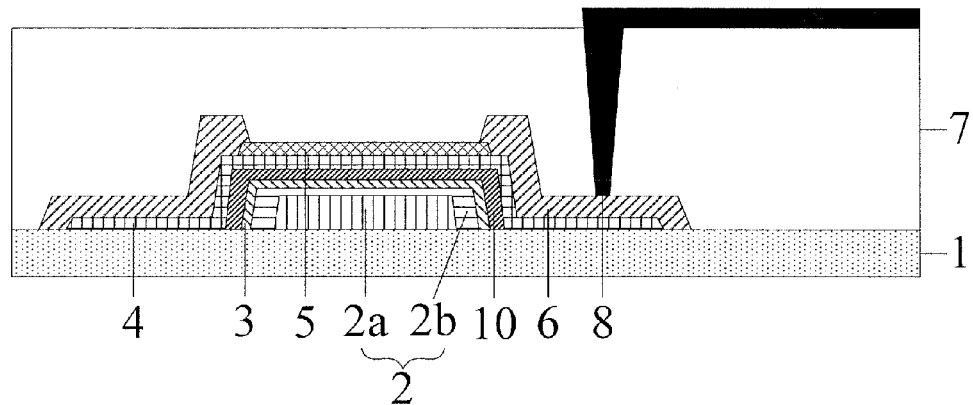
FIG. 7 is a structural representation of an array substrate according to a third embodiment of the present invention.

For the array substrate according to the first embodiment or the second embodiment, in order to further improve conductivity performance of the gate 2, as illustrated in FIG. 7, the gate 2 is formed into an inner gate layer 2a and an outer gate layer 2b; a material for the inner gate layer 2a comprises copper, and a material for the outer gate layer 2b comprises aluminum.

In the manufacturing process, the inner gate layer 2a comprising copper is first formed by deposition and etching on the substrate 1; the outer gate layer 2b comprising aluminum is then formed by deposition and etching, and the outer gate layer 2b covers the inner gate layer 2a. For example, the outer gate layer 2b covers the upper surface and the lateral surfaces of the inner gate layer 2a.

After forming of the gate 2 constituted of the inner gate layer 2a and the outer gate layer 2b, the outer gate layer 2a undergo an in-situ reaction directly to form the first gate insulating layer 3 comprising aluminum oxide.

Since copper has better electrical conductivity than aluminum, the gate 2 in the layered structure is obviously better than the gate 2 of a single layer of aluminum, thereby improving electrical conductivity of the TFT, allowing for the charging process of the pixel electrode 8 more quickly. Of course, the inner gate layer 2a may also be manufactured with another conducting material with electrical conductivity better than aluminum (Al).

In addition, in the process of forming the gate 2, the first gate insulating layer 3 and the second gate insulating layer 10, a gate line (not illustrated in the figure) connected with gate 2 is also deposited on the periphery of the TFT array substrate for transferring signals to the gate 2 through the gate line. The material for the gate line and the materials for the gate 2 are the same, and the materials for the insulating layers covering the gate line is the same as that for the first gate insulating layer 3 and the second gate insulating layer 10. Therefore, this avoids the diffusion of hydrogen and moisture into gate lines, hence ensuring electrical conductivity of gate lines.

An embodiment of the present invention further provides a display device comprising the above-mentioned array substrate.

The present invention further provides a method for manufacturing the TFT according to the above-mentioned first embodiment, comprising the following steps.

100, forming a gate on the substrate.

In manufacturing the array substrate of TFT, the substrate 1 to be used is cleaned, thereby keeping the substrate surface clean. The material for the substrate 1 may be glass or plastic. A glass substrate is used to manufacture a rigid array substrate, while a plastic substrate may be used to manufacture a flexible array substrate.

After cleaning, the substrate 1 is moved into a magnetron sputtering apparatus, and a deposition layer containing aluminum is deposited on the surface of substrate 1. After deposition, photoresist is coated and desired patterns are formed with the photoresist by exposure and development. Etching gases are introduced to etch the deposited layer and the residuary photoresist is cleaned to form the gate 2 on the substrate 1. Deposition time may be adjusted according to actual requirements to obtain the gate 2 of a corresponding thickness. For example, the gate 2 of a thickness of 220 nanometers may be formed.

101. forming a first gate insulating layer that covers the gate, wherein a material for the first gate insulating layer comprise aluminum oxide.

Oxygen plasma is acquired with the magnetron sputtering apparatus and introduced into the magnetron sputtering apparatus to obtain the required processing conditions such as a power density of 0.2-5 Watt per square centimeter and the partial pressure of oxygen of 0.2-1.2 pascal. In the magnetron sputtering apparatus, the oxygen plasma is accelerated by an applied magnetic field and bombs the gate 2 formed of aluminum on the substrate 1. The accelerated oxygen plasma enters the gate 2 formed of aluminum and thus reacts with aluminum element to form aluminum oxide, forming the first gate insulating layer 3 of aluminum oxide. In the fabrication process of the first gate insulating layer 3, the following reaction may be implemented by bombing the gate 2 with plasma: $xO^{2-}+Al=AlOx+2xe$ (AlOx is amorphous aluminum oxide, x is the molar ratio between oxyanion and aluminum ion in the aluminum oxide), amorphous aluminum oxide is formed in-situ via this reaction. The thickness of the first gate insulating layer 3 increases with the increase of reaction time, so that reasonable reaction time is set to finally form a TFT with good electrical conductivity. For example, the thickness of the first gate insulating layer 3 may be set between 5-50 nanometers.

When the gate 2 does not comprise aluminum, the first gate insulating layer 3 may be formed by directly depositing aluminum oxide on the gate 2. The method for forming the first gate insulating layer 3 is not limited herein.

102. forming an active layer.

After forming the first gate insulating layer 3, an active layer 4 is formed on the substrate 1 by a patterning process in the magnetron sputtering apparatus. In the process of manufacturing the array substrate, the etching stop layer 5, the source-drain electrode layer 6, the passivation layer 7 and the pixel electrode 8 may be further formed on the substrate 1 with the active layer 4 being formed already. The above-mentioned structure may be formed by magnetron sputtering or chemical vapor deposition.

In the process of manufacturing the TFT array substrate, as illustrated in FIG. 5, a via 9 exposing the drain of one side of the source-drain electrode layer 6 is formed by etching on the passivation layer 7. As illustrated in FIG. 5, a pixel electrode 8 is formed in the via 9 and on the passivation layer 7 to allow the pixel electrode 8 contact the drain of one side of the source-drain electrode layer 6.

Depending on actual requirements in the manufacturing process, a material for the source-drain electrode layer 6 may be one or any combination of molybdenum, tungsten molybdenum alloy, aluminum neodymium alloy and copper. Depending on actual requirements, the source-drain electrode layer 6 may be set as a single layer or a laminated structure, which is not limited herein.

A material for the active layer 4 may be indium gallium zinc oxide, hafnium indium zinc oxide, indium zinc tin oxide, yttrium indium zinc oxide or amorphous silicon.

A material for the etching stop layer 5 may be one or any combination of silicon dioxide, hafnium oxide, aluminum oxide, aluminum nitride and silicon oxide, and the etching stop layer 5 may be set as a single layer or a laminated structure depending on actual requirements, which is not limited herein.

A material for the passivation layer 7 may be one or any combination of silicon oxide, silicon nitride, silicon oxynitride, polyimide, polymethyl methacrylate and polyvidone.

A material for the pixel electrode 8 may be a transparent conductive material such as indium tin oxide, indium zinc oxide, polyethylene dioxy-thiophene or graphene.

A material for the substrate 1 is glass or plastic.

For example, the thickness of the gate 2 may be 1000~3000 nm. The thickness of the gate 2 may be realized by controlling the operation time of the apparatus. When the gate 2 contains aluminum, the aluminum in the gate is converted into aluminum oxide by an in-situ reaction, thereby the thickness of the gate 2 may be adjusted again after adjusting the deposited gate material and etching the gate 2 to achieve optimal electrical conductivity.

The embodiment of the present invention provide an TFT manufacturing method, the active layer covers the gate insulating layer and the gate and forms the gate insulating layer containing aluminum oxide, thereby making the gate insulating layer have better etching selectivity with respect to the etching stop layer, avoiding over-etching phenomenon occurring for the gate and the active layer during etching process. Since aluminum oxide has good compactness, it can effectively prevent hydrogen and moisture from diffusing into the gate insulating layer and the gate, thereby making electric performance of the TFT more stable. In addition, forming the gate insulating layer by an in-situ reaction of the gate can better control the thickness of the gate insulating layer, better adjust threshold voltage of the TFT, and decrease power loss in the charging process.

In order to further improve stability of the TFT, an embodiment of the present invention further provides a method for manufacturing the TFT according to the second embodiment. The method may further comprises, after forming the first gate insulating layer that covers the gates in which the material for the first gate insulating layer comprise aluminum oxide:

103, forming a second gate insulating layer that covers the first gate insulating layer, wherein a material for the second gate insulating layer comprises aluminum oxynitride.

In order to prevent many interface charges from appearing on the first gate insulating layer 3 during charging and leading to breakdown of the first gate insulating layer 3, after forming the first gate insulating layer 3, nitrogen and oxygen plasma is introduced into the magnetron sputtering apparatus, wherein nitrogen and oxygen plasma may be formed by ionizing mixture gas of nitrogen and oxygen, nitrogen oxide and oxygen, or the like in the magnetron sputtering apparatus under certain pressure, magnetic field and electric field. After the set conditions are reached in the magnetron sputtering apparatus, such as a power density of 0.2-5 Watt per square centimeter, the partial pressure of oxygen of 0.2-1.2 Pascal, under the action of the magnetic field, nitrogen and oxygen plasma bombs the first gate insulating layer 3 of aluminum oxide to allow nitrogen and oxygen plasma enter the first gate insulating layer 3 and reacts with aluminum oxide to generate aluminum oxynitride. As illustrated in FIG. 2, the second gate insulating layer 10 is formed on the surface of the first gate insulating layer 3, and the manufactured TFT array substrate has a structure as illustrated in FIG. 6.

The fabrication of the second gate insulating layer 3 may be implemented with an in-situ reaction. The implementation process of generating aluminum oxynitride is as follows: the following reaction may occur when bombing the amorphous aluminum oxide AlOx with plasma nitrogen: $AlOx+(1-2x/3)$ $N^{3-}$—$Al(OxN(1-2x/3))+3(1-2x/3)e$, and amorphous aluminum oxynitride is formed via this reaction.

In this embodiment, the introduction of nitrogen element may suppress diffusion of impurity ions, passivate the interface states and thereby improve reliability of the transistor and better control electric performance of the TFT.

The thickness of the second gate insulating layer 10 increases with the increase of reaction time. Therefore, it is required to set a reasonable reaction time to finally form a TFT with better electrical conductivity. For example, under the above-mentioned reaction conditions, processing of the first gate insulating layer 3 for 100 seconds may obtain a second gate insulating layer 10 with a thickness of about 2.7 nanometers.

In addition, the process of manufacturing the first gate insulating layer 3 and the second gate insulating layer 10 may also be implemented by chemical vapor deposition. Since gases introduced into the chemical vapor deposition apparatus is the same as that introduced into the magnetron sputtering apparatus, and the processes are also similar to each other, no further description will be given.

In forming the array substrate comprising the above-mentioned TFTs, the structure of the array substrate is illustrated in FIG. 5, no further description will be given here due to their similar structures.

In order to further improve physical performance of the TFT array substrate, the method further comprises after forming of the second gate insulating layer that covers the first gate insulating layer wherein a material for the second gate insulating layer comprises aluminum oxynitride:

104. annealing in nitrogen and oxygen atmosphere.

Nitrogen and oxygen are introduced into a heating apparatus and the process of annealing is conducted for 10 minutes-2 hours at 450 degree to remove the stress within the first gate insulating layer 2 and the second gate insulating layer 10, thereby reducing deformation and cleavage tendency of the first gate insulating layer 2 and the second gate insulating layer 10 and improving physical performance of the TFT array substrate.

In order to further improve the electrical conductivity of the gate 2, an embodiment of the present invention provides a method for manufacturing the TFT according to the third embodiment. Forming of a gate on the substrate comprise:

100a. depositing a copper layer on the substrate to form an inner gate layer.

A copper layer is formed first on the substrate 1 by a magnetron sputtering apparatus, and the inner gate layer 2a is formed by the first patterning process comprising exposure and development and by etching by introducing etching gases, as illustrated in FIGS. 3 and 7.

100b. depositing an aluminum layer to form an outer gate layer of the inner gate layer.

A second deposition layer comprising aluminum is deposited on the substrate 1 with the inner gate layer 2a formed thereon, and the outer gate layer 2b that covers the inner gate layer 2a is formed by patterning on the second deposition layer by exposure and development and by introducing etching gases for etching.

The first gate insulating layer 3 comprising aluminum oxide and the second gate insulating layer 10 comprising aluminum oxynitride are formed on the outer gate layer 2a in steps 101 and 103, which will not be described further.

Since copper has better electrical conductivity than aluminum, the gate 2 in the layered structure is obviously better than the gate 2 of a single layer of aluminum, thereby improving electrical conductivity of TFT and the corresponding TFT array substrate, realizing the TFT with better electrical conductivity and allowing for charging the pixel electrode 8 more quickly in the TFT array substrate.

The above is only exemplary implementations of the present invention, rather than for limiting protection scope of the present invention, which is defined by the appended claims.

The invention claimed is:

1. A thin film transistor comprising: a substrate and a gate, a first gate insulating layer and an active layer which are disposed in order on the substrate, the first gate insulating layer covering the gate, the active layer covering the first gate insulating layer, wherein a material for the first gate insulating layer comprises aluminum oxide, the first gate insulating layer covers an upper surface and all lateral surfaces of the gate, and the active layer covers an upper surface and all lateral surfaces of the first gate insulating layer;

wherein the active layer comprises portions located on the lateral surfaces of the gate, and the first gate insulating layer is not provided between the portions and the substrate in a direction perpendicular to the substrate.

2. The thin film transistor of claim 1, wherein a second gate insulating layer further disposed between the first gate insulating layer and the active layer; and the second gate insulating layer covers the first gate insulating layer and a material for the second gate insulating layer comprises aluminum oxynitride.

3. The thin film transistor of claim 1, wherein a material for the gate comprises aluminum.

4. The thin film transistor of claim 3, wherein the gate is layered into an inner gate layer and an outer gate layer; a material for the inner gate layer comprises copper, and a material for the outer gate layer comprises aluminum.

5. An array substrate comprising at least one thin film transistor, the thin film transistor comprising: a substrate and a gate, a first gate insulating layer, an active layer and an etching stop layer disposed in order on the substrate, the first gate insulating layer covering the gate, the active layer covering the first gate insulating layer, wherein a material for the first gate insulating layer comprises aluminum oxide, the first gate insulating layer covers an upper surface and all lateral surfaces of the gate, and the active layer covers an upper surface and all lateral surfaces of the first gate insulating layer, wherein the active layer comprises portions located on the lateral surfaces of the gate, and the first gate insulating layer is not provided between the portions and the substrate in a direction perpendicular to the substrate.

6. The array substrate of claim 5, wherein a second gate insulating layer is further disposed between the first gate insulating layer and the active layer; the second gate insulating layer covers the first gate insulating layer, and a material for the second gate insulating layer comprises aluminum oxynitride.

7. The array substrate of claim 5, wherein a material for the gate comprises aluminum.

8. The array substrate of claim 7, wherein the gate is layered into an inner gate layer and an outer gate layer; a material for the inner gate layer comprises copper, and a material for the outer gate layer comprises aluminum.

9. A display device comprising the array substrate according to claim 1.

10. A manufacturing method for thin film transistor, comprising:

forming a gate on a substrate;
forming a first gate insulating layer covering the gate, wherein a material for the first gate insulating layer comprises aluminum oxide, and the first gate insulating layer covers an upper surface and all lateral surfaces of the gate; and forming an active layer, wherein the active layer covers an upper surface and all lateral surfaces of the first gate insulating layer, wherein the active layer comprises portions located on the lateral surfaces of the gate, and the first gate insulating layer is not provided between the portions and the substrate in a direction perpendicular to the substrate.

11. The method of claim 10, after forming a first gate insulating layer covering the gate wherein a material for the first gate insulating layer comprises aluminum oxide, further comprising:

forming a second gate insulating layer that covers the first gate insulating layer, wherein a material for the second gate insulating layer comprises aluminum oxynitride.

12. The method of claim 11, after forming a second gate insulating layer covering the first gate insulating layer wherein a material for the second gate insulating layer comprises aluminum oxynitride, further comprising:

annealing in nitrogen and oxygen atmosphere.

13. The method of claim 10, wherein a material for the gate comprises aluminum.

14. The method of claim 13, wherein forming of a gate on the substrate comprises:

depositing a copper layer on the substrate to form an inner gate layer; and depositing an aluminum layer to form an outer gate layer of the inner gate layer.

15. The method of claim 13, wherein the first gate insulating layer is formed by an in-situ reaction of the gate.

16. The method of claim 15, wherein the second gate insulating layer is formed by an in-situ reaction of the first gate insulating layer.

17. The thin film transistor of claim 1, wherein the active layer comprises portions which are located on the lateral surfaces of the gate and contact the substrate.

* * * * *